United States Patent [19]

Aaroe

[11] 4,310,730

[45] Jan. 12, 1982

[54] SHIELDED PIEZOELECTRIC ACOUSTIC PICKUP FOR MOUNTING ON MUSICAL INSTRUMENT SOUNDING BOARDS

[76] Inventor: Kenneth T. Aaroe, 22747 Alice St., Hayward, Calif. 94541

[21] Appl. No.: 60,492

[22] Filed: Jul. 25, 1979

[51] Int. Cl.[3] ...................... H04R 15/00; H01L 41/04

[52] U.S. Cl. ................................ 179/110 A; 310/326; 310/324

[58] Field of Search .................... 179/110 A; 310/321, 310/324, 326, 329, 340; 84/1.16, 1.14

[56] References Cited

U.S. PATENT DOCUMENTS

| | | | |
|---|---|---|---|
| 3,167,668 | 1/1965 | Nesh | 310/340 |
| 3,506,857 | 4/1970 | Tolliver et al. | 310/329 |
| 3,538,232 | 11/1970 | Bachtig et al. | 310/329 X |
| 3,562,451 | 2/1971 | Mullen, Jr. et al. | 179/110 A |
| 3,700,938 | 10/1972 | Bryant | 179/110 A X |
| 3,728,562 | 4/1973 | Herson et al. | 310/326 |
| 3,970,879 | 7/1976 | Kumon | 179/110 A X |
| 3,979,565 | 9/1976 | McShane | 179/110 A |
| 4,030,396 | 6/1977 | Mariner | 310/321 X |
| 4,051,396 | 9/1977 | Berlincourt | 310/340 X |
| 4,054,808 | 10/1977 | Tanaka | 310/326 X |
| 4,156,156 | 5/1979 | Sweany et al. | 310/324 X |

*Primary Examiner*—Aristotelis M. Psitos
*Attorney, Agent, or Firm*—Linval B. Castle

[57] ABSTRACT

A piezoelectric transducer adapted for adherence to a sounding board of a musical instrument. The piezoelectric crystal has electrically conductive films on each surface. The first surface film is connected to the output conductor and the entire surface adheres to the insulated surface of a conductive inertial mass that is electrically connected to the second conductor surface of the crystal and to the output conductor shield, or ground reference, to provide self-shielding of the transducer and to obviate need for an additional shielded housing. The crystal-mass combination is then preferably potted in a suitable dipping plastic to form a small inexpensive pickup unit with high quality output which may be readily attached to a vibrating surface, such as a drum or an instrument sounding board.

10 Claims, 4 Drawing Figures

SHIELDED PIEZOELECTRIC ACOUSTIC PICKUP FOR MOUNTING ON MUSICAL INSTRUMENT SOUNDING BOARDS

BRIEF SUMMARY OF THE INVENTION

This invention relates to acoustic transducers and particularly to a simple efficient self-shielded piezoelectric transducer that may be adhesively attached to a musical instrument sounding board or the like.

Electronic amplification is employed very extensively in modern musical production and requires acoustic transducers such as microphones in close proximity to the musician or to the instruments, and/or pickups attached directly to the instruments, particularly those having sounding boards, such as pianos, guitars, or other stringed or percussion instruments. For example, my U.S. Pat. No. 4,058,045, describes and claims a pickup and sound amplification system for enhancing the sound from normally low quality pianos.

There are many types of acoustic pickups, one being the piezoelectric crystal type which relies on compression variations in the crystal, which may be quartz, barium titanate, or other compounds displaying piezoelectric qualities, for generating proportional electrical output variations. Many piezoelectric pickups operate by transmitting acoustic vibrations against the surface of a thin piezoelectric crystal and sensing the resulting electrical variations across conductors attached to the thin edges as the crystal is flexed. Patent 4,030,396 describes such a pickup with a backup mass for improving output levels. Other piezoelectric pickups rely upon the vibrational compression between the two surfaces and measure the corresponding electrical signals across conductors on these two surfaces. In this type of pickup, if one surface is exposed to acoustic vibrations, a relatively large inertial mass against the opposite surface is needed to prevent vibrational movement of the entire crystal so that it will compress with the acoustic vibrations as described in my aforementioned patent 4,058,045.

If any pickup is to be used near an external source of electromagnetic radiation, it must be suitably shielded to exclude the induced noise from the output signal. This is of particular importance with piezoelectric pickups because the relatively low output signal of this type of pickup makes it necessary to provide a relatively sensitive amplifier which, unfortunately, will also amplify very small electromagnetic interference that may be induced into the transducer or its output conductors. In such environments, it is clearly necessary to employ shielded cables between the pickup and its amplifier with the cable shield and pickup shield connected to ground to prevent induction of the external radiation into the system.

The acoustic pickup of the present invention employs a piezoelectric crystal which is vibrationally compressed as opposed to flexed, and is uniquely constructed so that no pickup shield is required. The resulting pickup is therefore a small, very simple, inexpensive and efficient transducer which may be readily attached, either permanently or temporarily with a suitable adhesive, to an acoustically vibrated surface such as the bell on a musical horn, the housing or sounding board of a stringed instrument, or to a percussion instrument.

Briefly described, the acoustic pickup of the invention includes a piezoelectric crystal having an electrically conductive inertial mass, such as a metal disc or a lead plate that, for increased output, should be heavier than the crystal. One surface of the mass is coated with a thin insulator, such as a nonconductive paper or a thin epoxy film and one conductive surface of the crystal is adhered thereto. The conductive film of the crystal surface adjacent the mass is connected to the center conductor of a shielded coaxial cable, and the exterior cable shield is connected to the conductive mass and also to the conductive film on the crystal surface opposite the mass so that the crystal is sandwiched between grounded conductors. The pickup may be used in this state or may be provided with a protective moisture-proof coating by dipping in a liquid plastic material.

DESCRIPTION OF THE DRAWINGS

In the drawings which illustrate a preferred embodiment of the invention.

DETAILED DESCRIPTION OF THE PREFERRED EMBODIMENT

Figure 1:
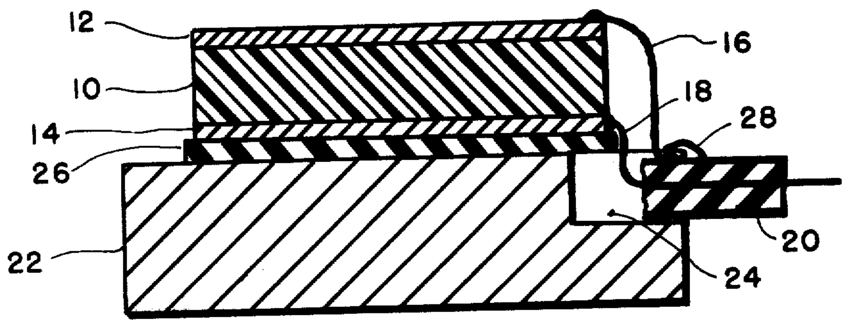
FIG. 1 is a cross-sectional elevation view illustrating the construction of the acoustic pickup of the invention.

FIG. 1 is a sectional elevation view of the acoustic pickup of the invention and illustrates a piezoelectric crystal 10 having on opposite surfaces conductive films 12 and 14. The crystal 10 may be a barium titanate crystal or any other type of crystal displaying piezoelectric properties and in the preferred embodiment is circular with a diameter of approximately 12.5 mm and a thickness of approximately 2.5 mm. Such crystals are in general use and are readily available from many sources. In this type of crystal, a mechanical force generated by acoustic vibrations between the surfaces of the crystal 10 will generate corresponding minute electrical voltage signals across the conductive films 12 and 14. Therefore, the conductive films 12 and 14 are connected via electrical conductors 16 and 18, respectively, to a shielded coaxial output cable 20 which carries the generated signal to appropriate amplifiers.

Figure 2:
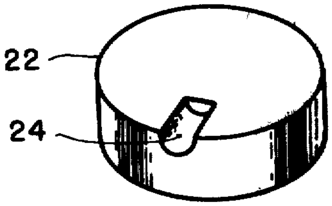
FIG. 2 is a perspective view illustrating the inertial mass employed in the pickup.

When the piezoelectric crystal is mounted to a musical instrument, the acoustic vibrations are applied only against one surface, such as the surface coated with the film 12. Because the crystal 10 is very light in weight, the entire crystal would vibrate and would not be compressed to produce the required output signal unless the opposite surface of the crystal is backed up with a suitable mass. Therefore, as illustrated in FIG. 1, the crystal 10 is mounted to an inertial mass 22 which is preferably a lead disc substantially heavier than the mass of the crystal 10. In the embodiment illustrated herein, the inertial mass 22 is a lead disc approximately two centimeters in diameter and one-half centimeter thick and together with the attached crystal has a total weight of about $\frac{5}{8}$ ounce. As best illustrated in FIG. 2, the inertial mass 22 has a pressed semicircular slot 24 extending in approximately one-fourth diameter from the arcuate surface. Slot 24 is not essential to the operation of the pickup but is provided in the preferred embodiment to provide a mounting slot for the shielded cable 20.

As illustrated in FIG. 1, the piezoelectric crystal 10 overlies a nonconductive spacer, such as an insulating film 26 on the surface of the mass 22. The insulating film 26 may, if desired, be a disc of insulating paper that is cemented to the film 14 and the surface of the mass 22, or may be comprised of an epoxy cement that is first applied to the surface of the mass 22 to provide adhesion and mounting for the crystal 10 and also the end of the cable 20.

Figure 3:
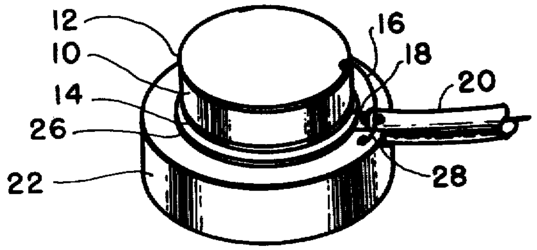
FIG. 3 is a perspective elevation view of the assembled acoustic pickup.

As previously discussed, crystal pickups produce low output signals which must be highly amplified. Therefore, extraneous electromagnetic radiation, such as that generated by fluorescent fixtures or the like, may induce a noise signal into a pickup that is not suitably shielded. As illustrated in FIG. 1, the conductive film 14 is insulated from the conductive mass 22 and is connected to the center conductor 18 of the shielded cable 20. The conductive film 12, which forms one of the outside surfaces of the pickup unit, is connected by conductor 16 to the exterior shielding of the cable 20. Similarly, the conductive mass 22 is also connected to the exterior shield of the cable 20 such as by the conductor 28, as best illustrated in FIG. 3. It can be seen, therefore, that the pickup is sandwiched between grounded conductors and that the pickup unit therefore rejects extraneous electromagnetic noise that would normally be introduced into the unit. Hence, the pickup is effectively completely shielded so that only the signal generated therein by acoustic vibration is produced in the conductive film 14 and transmitted through the coaxial cable 20 for suitable amplification.

The inertial mass 22 provides two important functions. First and of principal importance, the mass provides the shielding necessary to exclude externally generated noise without the need of a shielding housing. Second, it provides a backup to impede vibration of the entire crystal, hence improving the output signal amplitudes. In the construction of the pickup, electrically conductive lead or lead alloy is preferred for the inertial mass 22 because it is relatively inexpensive and is easy to assemble. It is apparent, however, that the mass 22 may be made of a molded plastic that is metallized with a conductive film on the side and bottom surfaces to provide shielding for the conductive film 14 of the crystal 10. Such a molded plastic mass will not require use of the separate insulation layer 26 but requires adhesion of the crystal 10 with a suitable cement.

Figure 4:
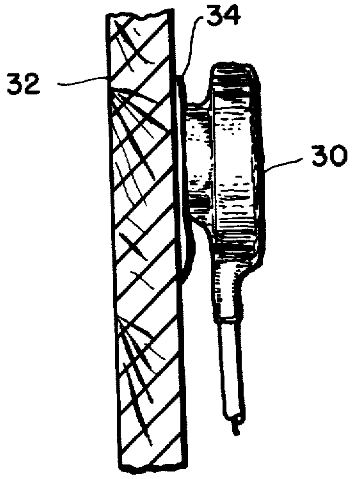
FIG. 4 is a perspective view of the assembled acoustic pickup with a moisture-proof plastic coating and is illustrated adhesively mounted to a sounding board of a musical instrument.

If desired, the unit assembled and illustrated in FIG. 3 may be used in its illustrated form by attaching the conductive film 12 to the sounding board of a suitable musical instrument. However, in order to provide protection for the pickup unit, to make it moisture-proof, and to prevent accidental removal of the cable 20 from the pickup, the pickup of FIG. 3, together with a suitable length of the coaxial cable 20, may be dipped in a liquid plastic material as illustrated in FIG. 4. In FIG. 4, the plastic coated pickup 30 is shown adhering to a musical instrument sounding board 32 by an adhesive material 34. The plastic coating for the pickup 30 of FIG. 4 is a readily available item and may be obtained from Plastic-Dip International of St. Paul, Minnesota. A preferred adhesive material 34 is a synthetic rubber based moisture sealer manufactured by 3M Company under the name of 3M Sealer No. 5354. This sealer provides a nearly permanent close-contact of the pickup 30 to the sounding board 32 and yet it remains in a plastic state so that the pickup 30 may be repeatedly removed and reattached to the sounding board.

Having thus described my invention, what is claimed is:

1. A piezoelectric acoustic pickup comprising:

a compression mode piezoelectric crystal having first and second opposite surfaces;

electrically conductive means on each of said first and second opposite surfaces, said conductive means on said first and second surfaces being respectively coupled to a signal output conductor and to a conductive shielding of said output conductor; and a non-resilient inertial mass having first and second opposite surfaces and side surfaces, said first surface of said mass contacting the conductive first surface of said crystal and electrically insulated from the conductive means on said first crystal surface, said non-resilient inertial mass being electrically conductive on at least said second and side surfaces, said electrically conductive non-resilient inertial mass surfaces being electrically connected to the conductive means on said second crystal surface.

2. The acoustic pickup claimed in claim 1 wherein the electrically conductive surfaces of said non-resilient inertial mass are electrically connected to said conductive means on said second surface of said crystal and to ground reference for shielding said pickup.

3. The acoustic pickup claimed in claim 2 wherein said non-resilient inertial mass has a weight substantially greater than the mass of said crystal.

4. The acoustic pickup claimed in claim 3 further including a shielded conductor for interconnecting said pickup to external circuitry, said first crystal surface conductive means being coupled to said shielded conductor, said second crystal surface conductive means and said non-resilient inertial mass conductive surfaces being connected to the shield of said shielded conductor.

5. The pickup claimed in claim 4 wherein said non-resilient inertial mass is an electrically conductive metal and is insulated from said first surface conductive means by a non-conductive spacer.

6. The acoustic pickup claimed in claim 5 wherein said spacer is insulating paper.

7. The acoustic pickup claimed in claim 5 wherein said spacer is epoxy cement providing both electrical insulation and adhesion of said crystal to said non-resilient inertial mass.

8. The acoustic pickup claimed in claim 5 wherein said pickup is coated with a protective coating of plastic.

9. The pickup claimed in claim 5 wherein the second surface of said pickup is applied to an acoustic member by an adhesive material.

10. The pickup claimed in claim 9 wherein said adhesive material is a synthetic rubber based moisture sealer that retains a plastic state for repeated removal and reattachment of said pickup.

* * * * *